United States Patent [19]

Kao et al.

[11] Patent Number: 5,200,962
[45] Date of Patent: Apr. 6, 1993

[54] DATA COMPRESSION WITH ERROR CORRECTION

[75] Inventors: Ming-Luh Kao; Jong-Keung Cheng, both of Miami, Fla.

[73] Assignee: Racal-Datacom, Inc., Sunrise, Fla.

[21] Appl. No.: 269,814

[22] Filed: Nov. 3, 1988

[51] Int. Cl.[5] ............... H03M 13/00; H03M 7/30
[52] U.S. Cl. .................................. 371/41; 375/122
[58] Field of Search ................ 371/41; 341/51, 65, 341/87, 94; 358/133, 134, 426, 261.2, 261.1, 261.3, 427, 430; 381/29, 30, 31, 32, 33, 34, 35; 370/79, 81, 109, 118, 111; 375/122

[56] References Cited

U.S. PATENT DOCUMENTS

| | | | |
|---|---|---|---|
| 3,237,170 | 2/1966 | Blasbalg et al. | 341/51 |
| 3,449,716 | 6/1969 | Brothman et al. | 376/6 |
| 3,496,549 | 2/1970 | Tong | 371/41 |
| 3,506,961 | 4/1970 | Abramson et al. | 371/41 |
| 3,875,344 | 4/1975 | Bogart | 375/122 |
| 4,047,151 | 9/1977 | Rydbeck et al. | 37/41 |
| 4,053,712 | 10/1977 | Reindl | 381/31 X |
| 4,302,775 | 11/1981 | Widergren et al. | 341/51 X |
| 4,560,976 | 12/1985 | Finn | 341/51 |
| 4,580,162 | 4/1986 | Mori | 341/51 X |
| 4,612,532 | 9/1986 | Bacon et al. | 341/51 |
| 4,654,853 | 3/1987 | Morlyama et al. | 371/41 |
| 4,665,514 | 5/1987 | Ching et al. | 370/109 X |
| 4,700,175 | 10/1987 | Bledsoe | 341/65 |
| 4,706,265 | 11/1987 | Furukawa | 375/122 |
| 4,758,899 | 7/1988 | Tsukiyama | 360/8 |

OTHER PUBLICATIONS

Hindin, H., "Transmitting data by satellite calls for special signal handling", Electronics, Mar. 29, 1979, pp. 91-98.

Clark, G., et al., Error-Correction Coding for Digital Communications, Plenum Press, N.Y., 1981, pp. 228-229.

Shacham, N. et al., "An Adaptive Hybrid ARQ Algorithm for Radio Channels", 1985 Int'l Conf. on Communications, IEEE, pp. 1390-1394.

Rosenburg, J., Dictionary of Computers, Information Processing and Telecommunications, 1987, John Wiley & Sons, p. 115.

Markus, Electronics Dictionary, 4th Ed., McGraw-Hill Book Co., New York, 1978, p. 153.

Graf, Electronics Learning Dictionary, 5th Ed., Howard W. Sams & Co., Inc., Indianapolis, Ind., 1982, p. 143.

Primary Examiner—Stephen M. Baker
Attorney, Agent, or Firm—Jerry A. Miller

[57] ABSTRACT

A combined data compression/error correction system suitable for use in synchronous communication utilizes a data compressor to produce variable rate compressed data from synchronous data. The variable rate compressed data is applied to a FIFO memory which is monitored to determine when the amount of data in the FIFO drops below a predetermined threshold. When it drops below this threshold, an error correction code generator generates a separator character and an error correction code which is appended to the compressed data in the FIFO. Thus, the additional bandwidth created by data compression is used to provide enhancement to the data integrity by providing a variable level of error correction varying in accordance with the free bandwidth generated by the data compressor.

12 Claims, 4 Drawing Sheets

DATA COMPRESSION WITH ERROR CORRECTION

CROSS REFERENCE TO RELATED APPLICATION

This application is related to an application entitled "MODEM WITH DATA COMPRESSION SELECTED CONSTELLATION" of Ming-Luh Kao which is commonly assigned and filed of even data herewith. This application may be identified by Ser. No. 07/269,812 now U.S. Pat. No. 4,937,844 issued Jun. 26, 1990. This application is incorporated herein by reference.

BACKGROUND

1. Field of the Invention

This invention relates generally to the fields of data compression and error correction. In particular, this invention relates to a device which utilizes data compression to free up bandwidth to be used for error correction.

2. Background

Error correction is commonly used in various devices and systems by appending a fixed number of Forward Error Correction (FEC) bits to a fixed number of data bits to allow for correction of a certain number of bit errors. Several methods of performing 'fixed' error correction are known in the art. In general, these methods generate a fixed number of error correction bits for each block of fixed length processed.

U.S. Pat. No. 3,506,961 to Abramson et al. describes an adaptive error correction system in which the number of burst errors are examined to determine what level of error correction is required to accomplish a fully correctable transmission. Then an error correction parameter is adjusted to manipulate the block size in accordance with the requirements of the channel. This patent also includes a rather extensive discussion of the background problems with error correction.

U.S. Pat. No. 4,047,151 to Rydbeck et al describes a technique for providing adaptive error correction in digital transmission of analog signals (e.g. voice or video) in which bits of lower significance are sacrificed to provide bandwidth for insertion of error correction bits. However, this arrangement is obviously unsuitable for transmission of digital information since it would actually produce errors which are uncorrectable.

Adaptive error control is also discussed in U.S. Pat. No. 3,496,549 to Tong in which one of several different error control mechanisms is selected based upon the error performance of the channel. For example, burst errors and random errors may be best handled by different error control strategies. This patent allows for tayloring the error correction scheme to best correct for the type of errors produced by the channel.

Several types of data compression are well known in the art. For example, Huffman coding and modifications thereof as described in U.S. Pat. No. 4,700,175 to Robert E. Bledsoe and assigned to the assignee of the present invention, have been used to provide data compression. Other data compression (or compaction) techniques are disclosed in, for example, U.S. Pat. Nos. 3,237,170 to Blasbalg et al, 4,560,976 to Finn, 4,612,532 to Bacon et al, and 4,706,265 to Furukawa. These patents are incorporated herein by reference.

In data compression environments, a constant data input rate is converted into a variable output data rate which is usually considerably lower on average than the input data rate. Thus, data compression typically provides the ability to transmit data using a lower bandwidth than would otherwise be required. Usually this decrease in required bandwidth is used to enhance throughput. That is, any bandwidth freed up by use of data compression is utilized to transport more data thus increasing the effective communication rate. This principal has been utilized, for example, in statistical multiplexers in order to pump more user data through a given link. It has also been utilized with data compressing asynchronous modems so that the modems may be rated at a higher information throughput than the communication channel and modem technology would normally allow.

Unfortunately, the advantage offered by data compression is difficult to utilize with synchronous communications links. Such links require the addition of a substantial level of flow control in order to utilize the variable rate output of a data compressor. A good example of this environment is that of a communication link using synchronous modems. The required flow control adds substantial complexity to the modem thereby substantially increasing its cost.

The present invention utilizes the increase in available bandwidth created by data compression advantageously to indirectly increase the data throughput by increasing the immunity of the data to noise, line disturbances, etc. By enhancing the integrity of the transmitted data, there is a lower need for retransmissions, etc. since many errors can be corrected without use of additional bandwidth.

SUMMARY OF THE INVENTION

It is an object of the present invention to provide a method and apparatus which enhances the integrity of transmitted data.

It is another object of the present invention to provide an adaptive data compressor operating in conjunction with an adaptive error corrector to provide error correction codes in accordance with the amount of bandwidth produced in the compression process.

It is another object of the present invention to provide a mechanism for utilizing data compression in a synchronous communication environment.

It is an advantage of the present invention to provide enhanced data integrity without sacrifice of data throughput.

These and other objects and advantages of the invention will become apparent to those skilled in the art upon consideration of the following description.

In one embodiment of the present invention, an improved data communication apparatus, includes a receiver for receiving a stream of data. A data compressor compresses the stream of data to produce compressed data with the compressed data requiring less bandwidth than the original stream of data so that the data compressor produces free bandwidth. An error correction processor generates error correction codes associated with the compressed data, the error correction codes occupying no more than the free bandwidth. The error correction codes are combined with the compressed data so that at least a portion of the free bandwidth is utilized for enhancing the integrity of the compressed data by utilizing the free bandwidth to carry error correction codes.

In a preferred implementation, the apparatus further includes a First In First Out (FIFO) memory receiving the compressed data. The status of the FIFO is monitored for determining when the FIFO contains less than a predetermined amount of data so that the error correction generator generates the error correction code when the FIFO contains less than the predetermined amount of data. A special separation character is used to separate the compressed data from the error correction codes.

In another embodiment, a method of processing variable rate data, includes the steps of monitoring a measure of an average rate of the data; generating an error correction code when the average rate drops below a predetermined threshold; and appending the error correction code to the data.

Another method of processing data according to the invention, includes the steps of receiving an input stream of synchronous data at a predetermined data rate; compressing the synchronous data to produce a variable rate stream of compressed data, the variable rate stream of compressed data having on average fewer bits than the stream of synchronous data; generating error correction codes having an adequate number of bits to restore the compressed data to the predetermined data rate; and combining the error correction codes with the variable rate compressed data to form an output stream of synchronous data comprising variable rate compressed data and error correction codes at the predetermined data rate.

Another method of converting a variable rate stream of data bits to a fixed rate stream of data bits, comprises the steps of receiving the variable rate stream of data bits; and generating a fixed number of error correction bits from a fixed number of the data bits at varying intervals to produce the fixed rate stream of data bits.

Yet another method of processing data according to the present invention, comprising the steps of receiving a stream of data; selecting a process for compressing the data in order to free bandwidth; compressing the data using the selected process to produce compressed data and free bandwidth; generating error correction code, the error correction codes being suitable for occupying the free bandwidth; combining the compressed data with the error correction codes to produce a combined information stream including compressed data and error correction codes occupying no more bandwidth than that occupied by the stream of data.

Another data communication apparatus according to the present invention includes in combination a data compressor and a circuit for ascertaining a level of compression obtained by the data compressor. An error correction code generator generates error correction codes having length related to the level of compression achieved by the data compressor so that a greater number of error correction bits are generated at higher levels of data compression.

According to the preferred embodiment, a combined data compression/error correction system suitable for use in synchronous communication utilizes a data compressor to produce variable rate compressed data from synchronous data. The variable rate compressed data is applied to a FIFO memory which is monitored to determine when the amount of data in the FIFO drops below a predetermined threshold. When it drops below this threshold, an error correction code generator generates a separator character and an error correction code which is appended to the compressed data in the FIFO.

Thus, the additional bandwidth created by data compression is used to provide enhancement to the data integrity by providing a variable level of error correction varying in accordance with the free bandwidth generated by the data compressor.

In another aspect of the present invention a method for measuring the compression level being obtained by a data compressor, includes the steps of receiving output from a data compressor; applying the output to a First In First Out (FIFO) memory; removing the data from the FIFO at a constant rate; monitoring the number of bits stored in the FIFO; and comparing the number of bits to a predetermined threshold.

In an apparatus for measuring the compression efficiency obtained by a data compressor, a First In First Out (FIFO) memory receives compressed data from the data compressor. Data is synchronously removed from the FIFO while monitoring the number of bits stored in the FIFO. Preferably, the monitoring is carried out by comparing the number of bits with a predetermined threshold.

The features of the invention believed to be novel are set forth with particularity in the appended claims. The invention itself, however, both as to organization and method of operation, together with further objects and advantages thereof, may be best understood by reference to the following description taken in conjunction with the accompanying drawings.

DETAILED DESCRIPTION OF THE INVENTION

Figure 1:
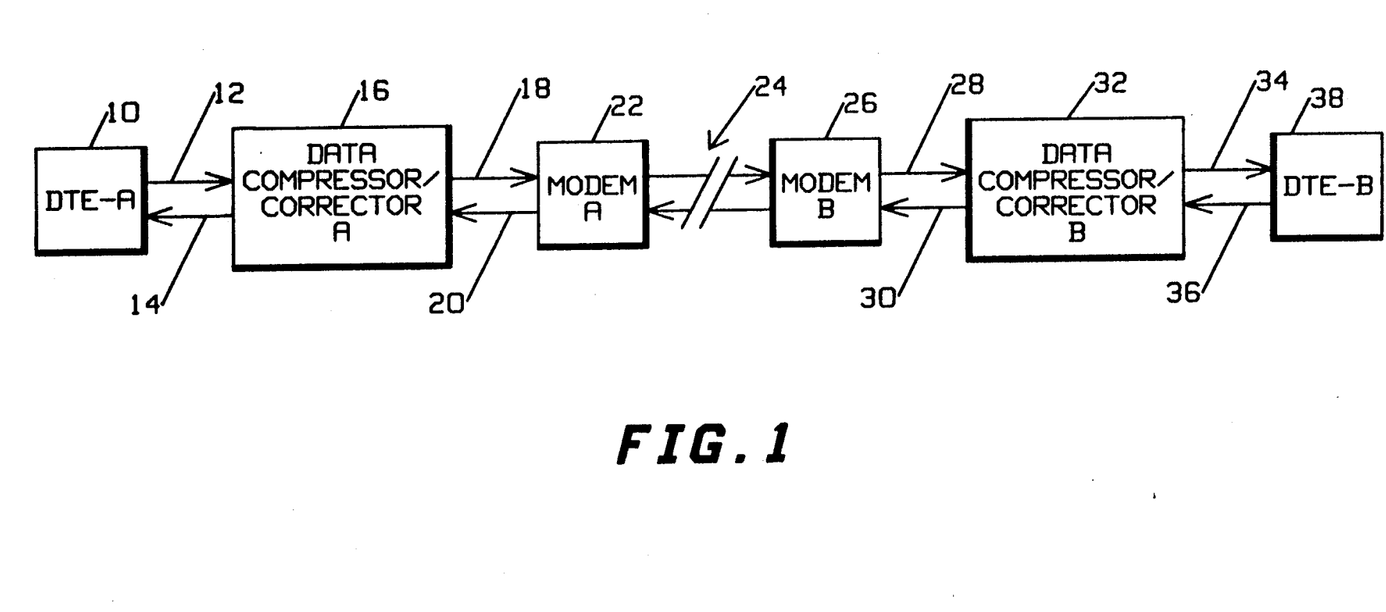
FIG. 1 shows a block diagram depicting the present invention used in one possible environment.

Turning now to FIG. 1, the present invention is shown in a simple point-to-point modem application. This example is only intended to be illustrative of one possible use for the present invention and should not be considered limiting. In this embodiment, a data terminal or other DTE type device 10 sends and receives preferably synchronous data over lines 12 and 14 respectively. Although illustrated as two separate lines for clarity, lines 12 and 14 may represent a single line or other variations. Lines 12 and 14 are coupled to a data compressor/error corrector device 16 according to the present invention. On the other side of data compressor/error corrector device 16 is a modem 22 which sends and receives compressed, error corrected data to device 16 via lines 20 and 18 respectively. Modem 22 operates in a known manner transmitting and receiving signals over a transmission medium 24 such as a leased telephone line to a similar modem 26. Modem 26 is similarly interconnected via lines 28 and 30 to a data compressor/error corrector device 32 which is similar to device 16. Device 32 is connected via lines 34 and 36 to another DTE or similar 38.

As will become clear shortly, the data compressor/error corrector devices of the present invention preferably include both a transmitter and a receiver. The transmitter implements a data compression process and an error correction code generation process. The receiver generates a data expansion process and an error correction process. For simplicity, the term "data compressor" and the like as used herein may generally encompass a device which both compresses and expands, and the term "error corrector" and the like as used herein may encompass a device which both generates error correction codes and actually corrects the data (that is both transmitter and receiver portions).

In operation, the data compressor/error corrector (e.g. 16) of the invention compresses data received from DTE 10, preferably in an adaptive manner to account for varying statistics of the data. This may involve selecting a compression process from one of a plurality of processes. The nature of data compression is that the level of compression (sometimes referred to as data compaction) obtained is a function of the data characteristics and is thus unpredictable. By using one of several known techniques, adaptive data compression can be used to provide a degree of optimization of the amount of compression achieved. In addition, since the statistical characteristics of the data may change dynamically, it may be advisable to change the compression techniques or adapt the technique in known manners dynamically during transmission. Device 16 then determines how to implement error correction on the basis of how much bandwidth has been saved by compression. That is, when larger data compression ratios are achieved resulting in a great deal of free bandwidth, a greater amount of bandwidth can be allocated to error correction. Table 1 illustrates the amount of bandwidth which can allocated to error correction under various conditions of compression. According to one embodiment of the present invention, a fixed number of error correction bits are generated for a fixed number of data bits at a variable interval. In other embodiments, it may be desirable to actually change the type of error correction to fit the available free bandwidth. This is expressed in Table 1 in terms of the ratio of forward error correction (FEC) bits to compressed data bits.

TABLE 1

| Compression Ratio | FEC/Data Ratio |
| --- | --- |
| 1:1 | 0 |
| 2:1 | 1:1 |
| 3:1 | 2:1 |
| 4:1 | 3:1 |

Figure 2:
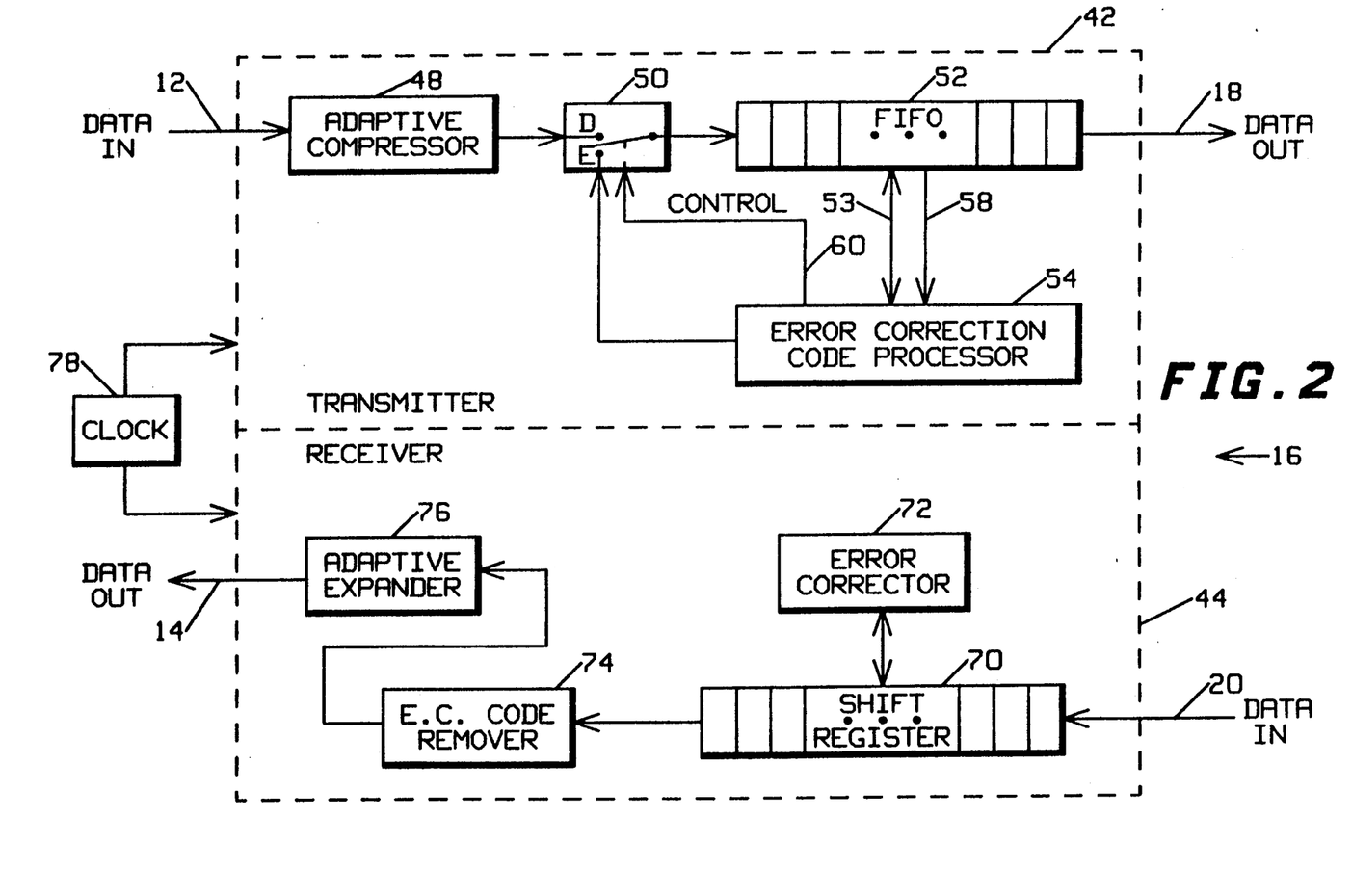
FIG. 2 shows a functional block diagram of an embodiment of the present invention.

Turning now to FIG. 2, a more detailed functional block diagram of data compressor/error corrector device 16 is shown to include a transmitter 42 and a receiver 44. In the preferred synchronous mode of operation, a constant rate data stream from the DTE enters the transmitter 42 at an adaptive compressor 48 where the constant rate data is compressed in accordance with the characteristics of the data to produce a variable rate stream of data at the output of the adaptive compressor 48. The variable rate data passes through a switch 50 (in position D) to a First In First Out (FIFO) memory 52. The output of FIFO 52 forms the data output 18 of the data compressor/corrector 16.

The content of the FIFO 52 is accessible via line (bus) 53 to an error correction code processor 54 which also receives status information 58 from FIFO 52 and controls the position of switch 50 with control line 60. The status of the FIFO 52 is monitored by the error correction code processor 54 to determine the compression efficiency of the adaptive corrector 48. Processor 54 generates appropriate FEC codes for the compressed data and as required switches the switch to position E to load those FEC codes into the FIFO for ultimate transmission over line 18. Adaptive compressor 48 may include buffering so that compressed data is not lost during the time period that the switch 50 is in position E.

Variable rate error correction, according to one embodiment of the present invention, may be achieved by applying traditional fixed rate error correction schemes in an adaptive manner based upon the available bandwidth. The error correction scheme preferably should be implemented such that the error correction codes are separated from the actual compressed data so as not to interfere with the data itself. If the available bandwidth is high, i.e. the compression ratio is high, the error correction code can be generated and transmitted more frequently. If there is no extra bandwidth, i.e. the compression ratio=1:1, the error correction code will not be transmitted at all and may not be generated at all. The overhead required for this adaptive scheme is simply the overhead of a special separation character used to separate the data from the error correction code. This separator should be a character which is not used for other combinations of compressed data and should be absolutely distinct from all possible combinations of compressor output. In the event the compressor uses all available code space so that no such character exists, a scheme similar to that of High level Data Link Control (HDLC) may be adopted by using a code such as 01111110 as the separator and inserting a zero whenever five consecutive ones are encountered at the compressor output. Other possibilities will occur to those skilled in the art. Since a fixed number of error correction bits are loaded into the FIFO each time, a separator character need only be used prior to the insertion of the error correction bits in this embodiment. In other embodiments, a variable number of error correction bits may be used in which case the error correction bits should be bracketed by the separator character and may also include information identifying the number, type, etc. of error correction bits to be used.

When the data at the FIFO 52 falls below a predetermined threshold th, the error correction code processor 54 is activated and the switch 50 switches to position E. Based upon the previous NB bits of data, the error correction code processor 54 will generate NEC bits of error correction code and send this error correction code to the FIFO 52. These error correction code bits are merely appended to the data and separated by a separation character as was previously described. The threshold th is chosen such that the error correction code processor 54 has sufficient time to generate the error correction code and at least begin placing it in the FIFO 52 before the FIFO 52 empties of data. The processor 54 should also include internal memory to store the preceding NB bits of data for purposes of generating error correction codes therefrom.

The minimum FIFO size may be computed as follows:

Min FIFO Size = NEC + th where:
NEC = number of error correction bits to be appended,
th = tp*C = threshold, tp = processing time required to generate error correction bits,
C = rate of removal of data from the FIFO.

Buffering may be required as part of the adaptive compressor 48 if the error correction code processor 54 is unable to generate the error correction code and place it on the FIFO 52 prior to the next data bit output from the adaptive compressor 48. After the NEC bits of error correction code are sent to the FIFO 52, switch 50 is switched back to position D and the process is repeated. Thus, depending upon the compression level (compression ratio) achieved by the adaptive compressor 48, the error correction code will be generated at varying intervals to achieve a variable error correction scheme related directly to the degree of compression achieved.

The use of the FIFO 52 in conjunction with comparison with the comparator provides a measure of the compression ratio being obtained from the compressor 48. The output of the FIFO 52 is a synchronous stream of data bits being removed from the FIFO while the input is of variable rate. It is noted, that the compression ratio is directly related to the frequency at which the error correction codes are generated. When high levels of compression are achieved, error correction codes are generated more frequently. This information may be used to measure the compression efficiency of the data compressor and may also be displayed, tabulated, etc. if desired.

Let F be the frequency at which the error correction codes are generated; let r be the compression ratio (e.g. r=2 means a compression ratio of 2:1); then F and r are related by the following equation:

$$r = C/(C - F^*NEC).$$

Where C is the data rate before compression or equivalently, the rate of removal of data from the FIFO. Thus, r can be calculated by measuring the value of F.

As part of the initialization process, FIFO should preferably be filled to at least the threshold th before starting the process.

The error correction code processor 54 may use any known fixed rate error correction process so long as the error correction code may be separated from the data itself according to the above embodiment. Those skilled in the art will likely find other error correction schemes which may also be adapted for use in accordance with the amount of bandwidth produced by a data compressor.

In operation of the receiver, received data enters the receiver at line 20 which is coupled to a shift register 70. The content of the shift register 70 is monitored continuously by an error corrector 72. When error corrector 72 detects an error, it corrects the error by replacing the erroneous bit or bits in the shift register with corrected ones. The corrected data along with error correction codes pass through the shift register 70 to an error correction code remover 74 which strips the error correction codes and passes the remaining compressed data to an adaptive data expander 76. The adaptive data expander 76 performs the opposite function of the adaptive compressor 48 and restores the compressed data to its original uncompressed form to produce a synchronous data stream at line 14.

The data stream from the communication medium is of constant speed comprising either compressed data or error correction code and should have no idle period. Both transmitter 42 and receiver 44 utilize clock signals from a clock 78 in a known manner to clock in synchronous data and clock out synchronous. Clock 78 may generally lock on to the system clock of the synchronous system in a known manner. At the receiver, the incoming bit stream is fed into the shift register 70 of at least NB+NEC length. The error corrector 72 begins the error correction process as soon as a complete error correction code has been entered into the shift register 70. The preceding NB bits of data are corrected as necessary according to the error correction code received by modifying the contents of the shift register. The corrected output of the shift register 70 is then stripped of the error correction code and separators as required to produce only compressed variable length data which is restored to its original condition by the adaptive expander 76. To external devices, both the transmitter and receiver portion receive and produce constant rate data thus alleviating the need for any flow control mechanism and providing compatibility with synchronous devices.

While FIG. 2 depicts the present invention in the form of separate functional blocks, the present invention may be implemented by use of one or more general purpose or signal processing microprocessors which are suitably programmed. Those skilled in the art will appreciate that the number of processors used depends upon the complexity of the compression and error correction algorithms used as well as the speed of the data.

Figure 3:
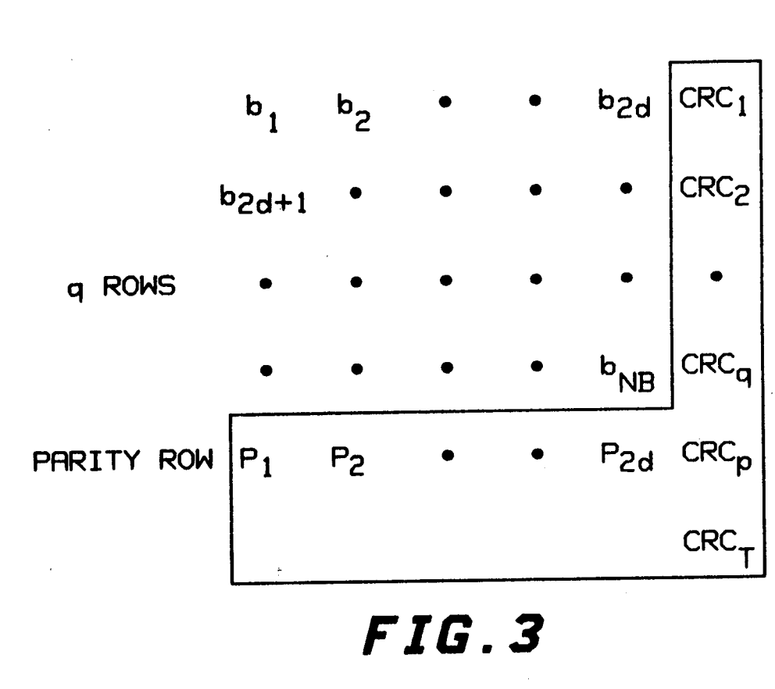
FIG. 3 illustrates an error correction code used with one embodiment of the present invention.

Turning now to FIG. 3, an implementation of an error correction process according to the present invention is shown. This process corrects single bursty errors of up to d bits within T bits of transmission. The error correction code processor works on a block of data of fixed size, say NB bits. NEC bits of error correction code (including the separator character) are generated. Assuming that errors occur in a bursty fashion, with duration of each error burst being no longer than d bits of transmission time, and that there are no more than one error burst in each T bit of transmission time. NB should be chosen so that NB is less than or equal to T and NB is an integer multiple of 2d. These NB bits of data can be arranged to form a matrix having 2d columns and q=NB/2d rows. In FIG. 3, $b_1, \ldots, b_{NB}$ is the sequence of data bits and $CRC_i$ is a cyclic redundancy check word for row i. The parity check for column j is $P_j$. $CRC_p$ is the CRC word for the parity row and $CRC_T$ is the cyclic redundancy check word for the sequence $CRC_1, CRC_2, \ldots, CRC_q$ and $CRC_p$.

The bit sequence starting with the separator character, followed by $P_1, \ldots, P_{2d}, CRC_1, \ldots, CRC_q, CRC_p, CRC_T$, is the error correction code for these NB bits of data. The length of this error correction code is NEC bits where:

NEC = # of bits of separator character +

2d for the parity row + (q + 2)*(# of bits in CRC word).

It should be noted that NB bits of data upon which the error correction scheme works will not necessarily be pure data since it may include one or more error correction codes from previous data. This is especially true when the compression ratio is large. Once the error correction codes are loaded into FIFO 52, they are subject to being treated as ordinary data bits. Thus, the error correction codes for high compression rates may actually have several layers of error correction codes generated for them. For purposes of clear terminology, once the error correction codes are loaded into the FIFO 52, they will be considered to be, for purposes of error correction code generation, the same as data bits. Thus, when this document refers to generation of error correction code bits from data bits, the data bits may actually be error correction code bits generated from previous data bits, etc.

Figure 4:
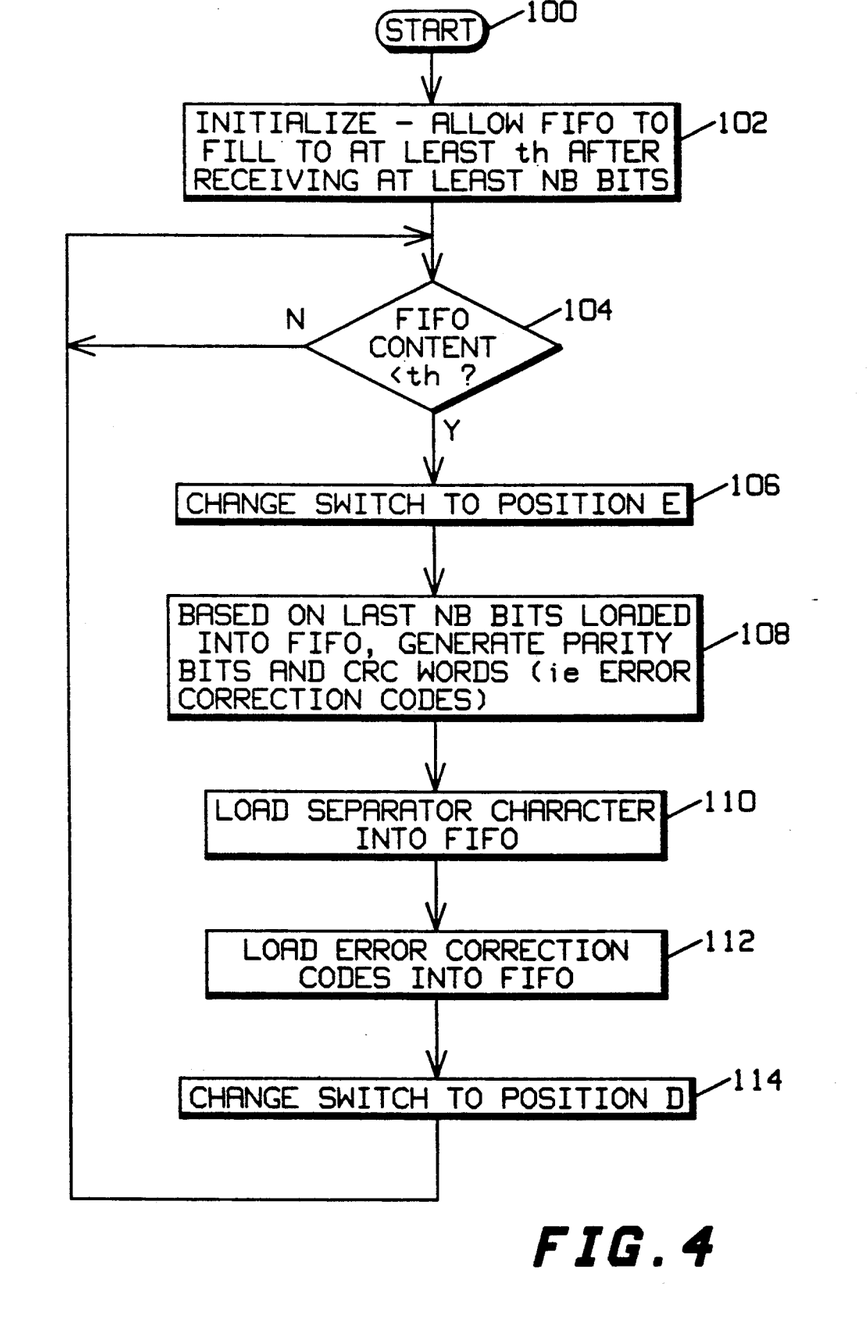
FIG. 4 is a flow chart of the operation of the error corrector of one embodiment of the present invention.

Turning now to FIG. 4, a flow chart of the operation of the error correction encoding process begins at 100. At step 102, the system is initialized by allowing the FIFO to fill to at least the threshold th. Control then passes to 104 where the FIFO content is checked and compared with th. If the number of bits in the FIFO is greater than the threshold, the process waits at 104 until the FIFO content is less than the threshold. When the FIFO content is less than the threshold th, control passes to 106 where the position of switch 50 is changed to position E. Control then passes to 108 where error correction bits are computed using the last NB bits which were loaded into the FIFO according to the mechanism stated above and in conjunction with FIG. 3. A separator character is then loaded into the FIFO at step 110 and control passes to 112 where the error correction codes are loaded into the FIFO. The switch 50's position is switched to D at 114 and control passes back to 104 to await the next threshold crossing. It should be clear that several of the steps in this process may be rearranged without affecting the invention. For example, step 110 could be taken between steps 106 and 108 without departing from the present invention.

Figure 5:
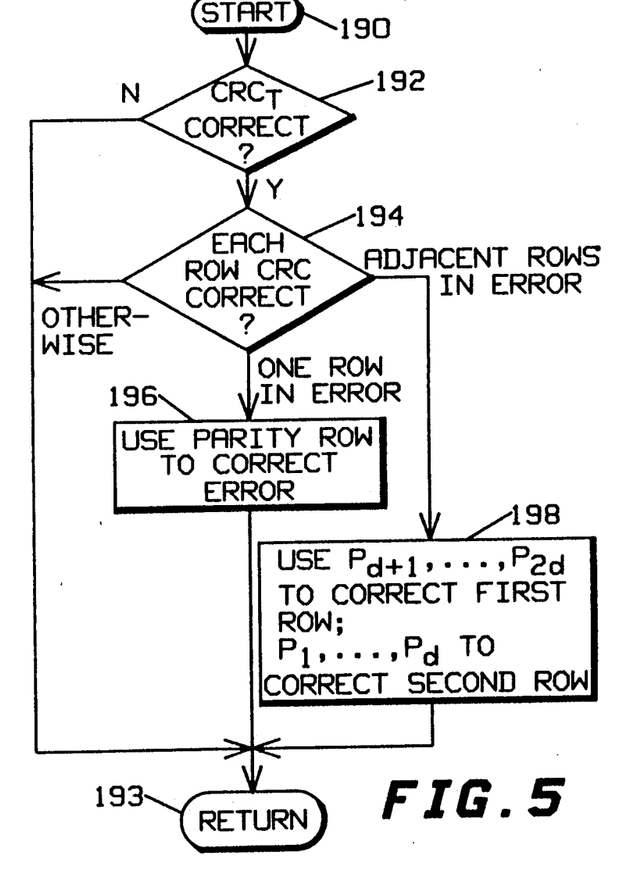
FIG. 5 is a flow chart of the operation of the error correction encoding process of the present invention.

Turning now to FIG. 5, the error correction process as implemented at the decoder according to the above scheme starts at 190 upon detection of the separator character by the error corrector 72. The error correction code will be used to correct the NB bits of data in the shift register 70. At step 192, the $CRC_T$ cyclic redundancy check word is checked to assure the accuracy of the sequence $CRC_1$, $CRC_2$, ..., $CRC_q$ and $CRC_p$. If there is an errror, the process at 193. Otherwise, $CRC_1$, $CRC_2$, ..., $CRC_q$ and $CRC_p$ are used to detect any errors appearing in each row at step 194 by checking each row's associated CRC at 194. If there are no errors, the process ends at 193. Under the assumption that there is at most one error burst in these NB bits of data, and that the error burst duration cannot be longer than d bits, there can be at most two rows which have incorrect CRC values. If only one row contains an error at 194, control passes to 196 where the parity row is used to determine the location of the error and correct it after which control passes back to 193. If two rows are in error at 194, these rows must be adjacent and the errors must be concentrated in the right half of the first row and the left half of the second row. Control passes to 198 where the error corrector uses the right half of the parity row to correct the first row and the left half of the parity row to correct the second row. Control then passes to 193.

Of course those skilled in the art will appreciate that many other error correction schemes may be similarly adapted to variable rate operation as described in conjunction with the variable rate output of a data compressor. For example, both row and column parity may be used in conjunction with the above techniques to provide error correction along with row and column CRC codes. In addition, although the preferred embodiment utilizes one or more programmed general purpose microcomputers to implement the bulk of the invention, this is not to be limiting since hard wired logic circuits, custom integration and other alternatives are equivalent. Also, those skilled in the art will recognize that the FIFO and shift registers of the present invention may be implemented as data structures in working memory of a microcomputer without departing from the present invention. Other variations will occur to those skilled in the art.

Thus it is apparent that in accordance with the present invention, a method that fully satisfies the aims, advantages and objectives is set forth above. While the invention has been described in conjunction with with specific embodiments, it is evident that many alternatives, modifications and variations will become apparent to those skilled in the art upon consideration of the foregoing description. Accordingly, it is intended that the present invention embrace all such alternatives, modifications and variations as fall within the spirit and broad scope of the appended claims.

What is claimed is:

1. A data communication apparatus, comprising in combination:
    receiving means for receiving a stream of data;
    compressing means for compressing said stream of data to produce compressed data, said compressed data requiring less bandwidth than said stream of data so that said compressing means produces free bandwidth;
    error correction means for generating error correction codes associated with said compressed data, said error correction codes occupying no more than said free bandwidth;
    combining means for combining said error correction codes with said compressed data so that at least a portion of said free bandwidth is utilized for enhancing the integrity of said compressed data by utilizing said free bandwidth to carry error correction codes;
    a First In First Out (FIFO) memory receiving said compressed data;
    means for determining when said FIFO contains less than a predetermined amount of data; and
    wherein said error correction means generates said error correction code when said FIFO contains less than said predetermined amount of data.

2. The apparatus of claim 1, wherein said compressing means includes adaption means for adapting the compression according to characteristics of said stream of data.

3. The apparatus of claim 1, further comprising:
    means for generating a separator character; and
    wherein said combining means includes means for inserting said separator character between said compressed data and said error correction codes.

4. The apparatus of claim 1, wherein said error correction means includes means for generating a fixed number of error correction bits from a fixed number of compressed data bits at varying time intervals.

5. The apparatus of claim 1, further comprising:
    wherein said combining means includes means for loading said error correction code into said FIFO.

6. The apparatus of claim 5, further comprising:
    means for generating a separator character; and
    wherein said combining means includes means for inserting said separator character between said compressed data and said error correction codes.

7. A method of processing variable rate data, comprising the steps of:

monitoring a measure of an average rate of said data;

generating an error correction code as a result of said average rate dropping below a predetermined threshold;

appending said error correction code to said data; and generating a separator code and inserting a separator code between said data and said error correction code.

8. The method of claim 7, wherein said error correction code is generated from a fixed number of data bits and wherein said error correction code is a fixed number of bits in length.

9. The method of claim 7, wherein said monotoring step includes loading said variable rate data into a First In First Out (FIFO) memory and examining the amount of data in said FIFO.

10. The method of claim 9, further comprising generating said error correction code when said amount of data in said FIFO drops below a predetermined threshold.

11. A method of processing data, comprising the steps of:

receiving an input stream of synchronous data at a predetermined data rate;

compressing said synchronous data to produce a variable rate stream of compressed data, said variable rate stream of compressed data having on average fewer bits than said stream of synchronous data;

generating error correction codes having an adequate number of bits to restore said compressed data to said predetermined data rate;

combining said error correction codes with said variable rate compressed data to form an output stream of synchronous data comprising variable rate compressed data and error correction codes at said predetermined data rate;

generating a fixed number of forward error correction bits from a fixed number of said data bits at varying intervals; and generating a separator character and placing said separator character between said data bits and said error correction bits.

12. A method of converting a variable rate stream of data bits to a fixed rate stream of data bits, comprising the steps of:

receiving said variable rate stream of data bits;

generating a fixed number of error correction bits from a fixed number of said data bits at varying intervals to produce said fixed rate stream of data bits;

placing said variable rate stream of data bits into a First In First Out (FIFO) memory;

monitoring the number of bits stored in said FIFO memory; and generating said error correction bits when said number of bits stored in said FIFO drops below a predetermined threshold.

* * * * *